United States Patent [19]
Tanaka et al.

[11] Patent Number: 6,097,204
[45] Date of Patent: *Aug. 1, 2000

[54] INSPECTION APPARATUS WITH REAL TIME DISPLAY

[75] Inventors: Hideaki Tanaka, Nirasaki; Yuichi Abe, Hachioji, both of Japan

[73] Assignee: Tokyo Electron Limited, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/773,903

[22] Filed: Dec. 27, 1996

[30] Foreign Application Priority Data

Dec. 30, 1995 [JP] Japan ................................. 7-352827
Sep. 14, 1996 [JP] Japan ................................. 8-265149

[51] Int. Cl.$^7$ ................................................ G01R 31/319
[52] U.S. Cl. .......................................... 324/765; 324/555
[58] Field of Search ................................. 324/754, 758, 324/765, 707, 708, 709, 555

[56] References Cited

U.S. PATENT DOCUMENTS

| | | | |
|---|---|---|---|
| 3,723,694 | 3/1973 | Conta et al. ........................... | 219/69.2 |
| 4,950,982 | 8/1990 | Obikane et al. ....................... | 324/754 |
| 5,065,092 | 11/1991 | Sigler ................................... | 324/758 |
| 5,219,765 | 6/1993 | Yoshida et al. ....................... | 324/754 |
| 5,254,939 | 10/1993 | Anderson et al. ................. | 324/754 X |
| 5,381,344 | 1/1995 | Rohrbaugh et al. .................... | 364/490 |
| 5,506,498 | 4/1996 | Andeson et al. ................... | 324/754 X |
| 5,511,005 | 4/1996 | Abbe et al. ......................... | 324/765 X |
| 5,585,737 | 12/1996 | Shibata ................................. | 324/754 |
| 5,670,888 | 9/1997 | Cheng ................................... | 324/754 |
| 5,700,127 | 12/1997 | Harada et al. ........................ | 414/416 |

FOREIGN PATENT DOCUMENTS 62-11146 1/1987 Japan .
3-245547 11/1991 Japan .

*Primary Examiner*—Michael Brock
*Attorney, Agent, or Firm*—Oblon, Spivak, McClelland, Maier & Neustadt, P.C.

[57] ABSTRACT

An inspection apparatus comprises a prober section having a main chuck and a prober, and a loader section having a support table, a sub-chuck and a forceps assembly. A controller controls the forceps assembly, the sub-chuck, the main chuck and the prober such that the forceps assembly conveys a semiconductor wafer in a cassette on the table before inspection from the cassette to the sub-chuck, the sub-chuck prealigns the semiconductor wafer, the forceps assembly conveys the prealigned semiconductor wafer to the main chuck, the prober inspects the semiconductor wafer supported by the main chuck, and then the forceps assembly conveys the inspected semiconductor wafer to the cassette. A wafer state display device is provided for performing display on a display screen so as to visually recognize whether the semiconductor wafer in the cassette is not inspected or has been inspected, and for graphically displaying movement of the semiconductor wafer between the cassette and the main chuck on the display screen in real time.

6 Claims, 15 Drawing Sheets

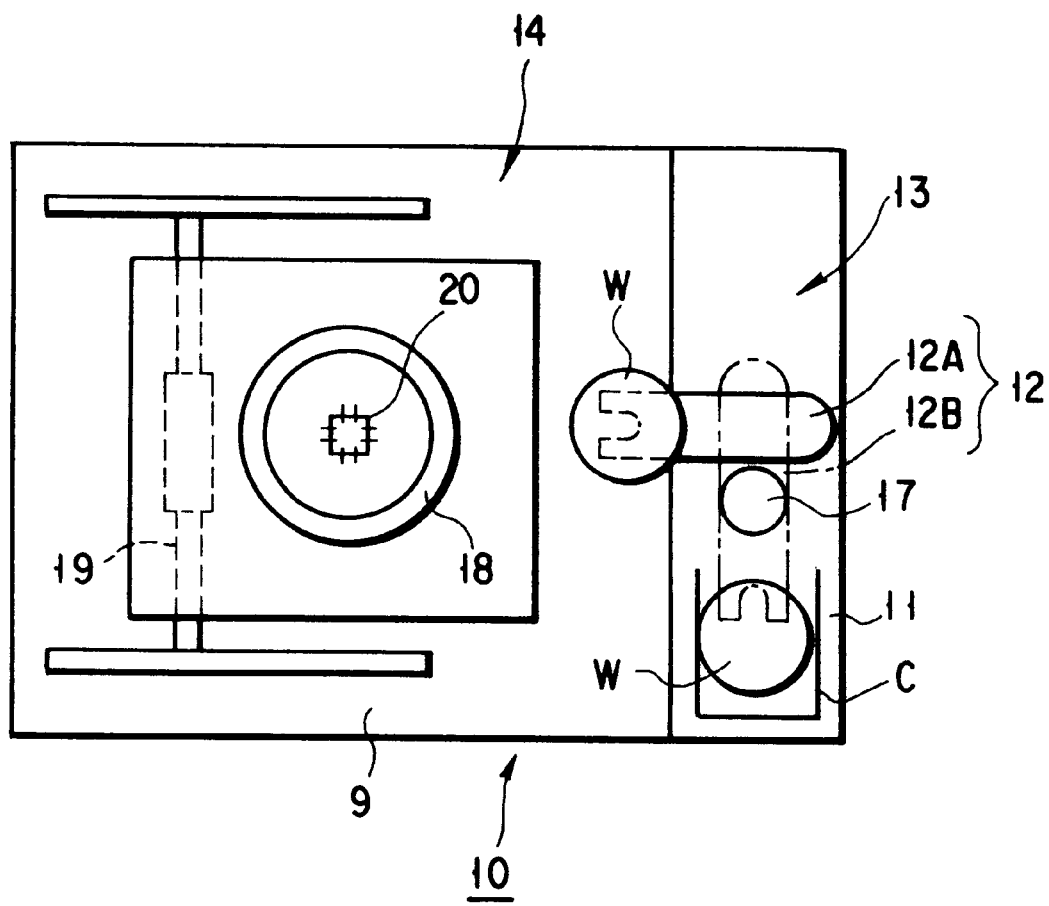
F I G. 3

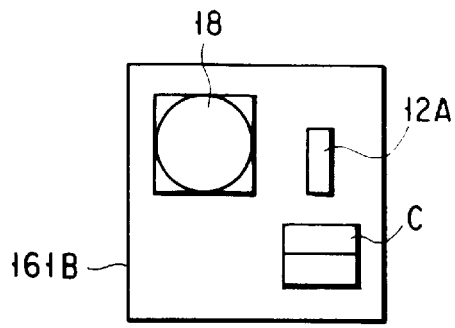
S: EXECUTING PROBE ALIGNMENT
L: EXECUTING MAP SAMPLING
F I G. 7A
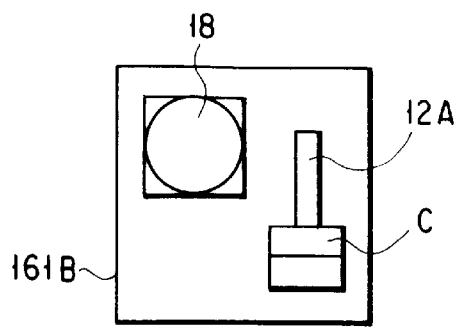
S: EXECUTING PROBE ALIGNMENT
L: REMOVING
F I G. 7B
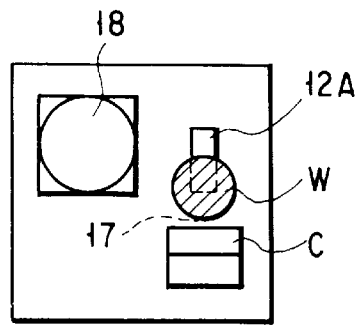
S: STOP
L: EXECUTING PREALIGNMENT
F I G. 8A
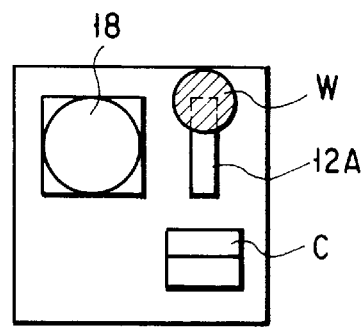
S: STOP
L: EXECUTING ID READING
F I G. 8B
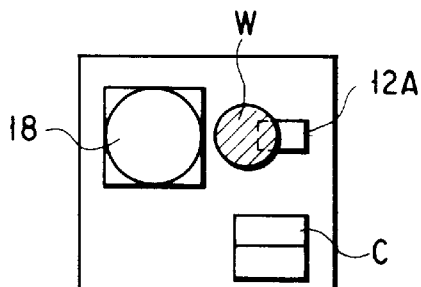
S: STOP
L: WAITING
F I G. 9A
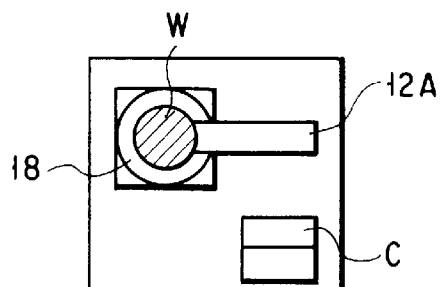
S: LOADING
L: LOADING
F I G. 9B

S: EXECUTING ALIGNMENT
L: STOP

S: EXECUTING ALIGNMENT
L: REMOVING

S: EXECUTING ALIGNMENT
L: REMOVING

S: EXECUTING ALIGNMENT
L: EXECUTING PREALIGNMENT

S: MEASURING
L: WAITING

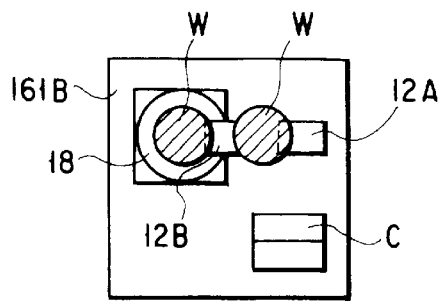
F I G. 12A
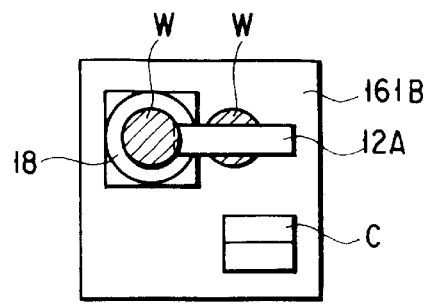
F I G. 12B
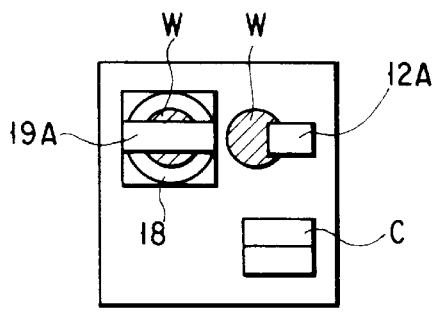
F I G. 13A
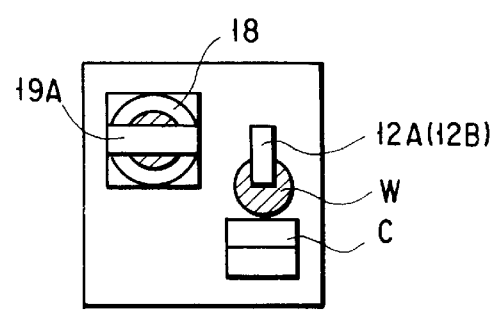
F I G. 13B
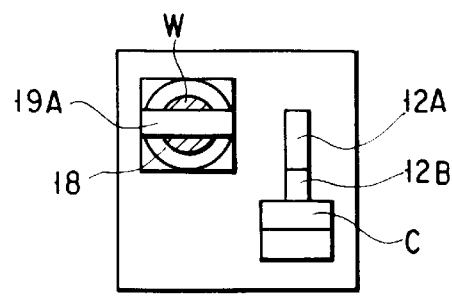
F I G. 13C

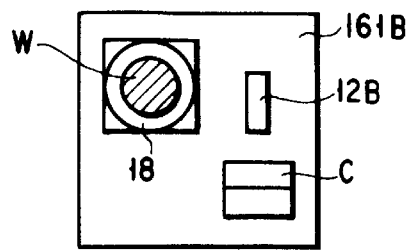
S: MEASURING
L: RETURNING
F I G. 14 A
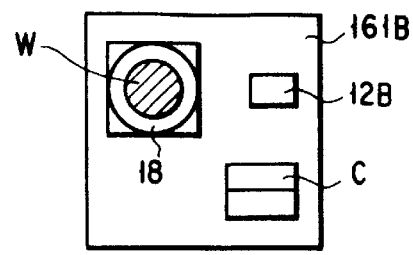
S: MEASURING
L: STOP
F I G. 14 B
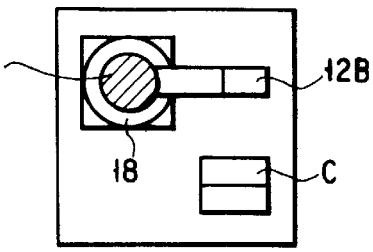
F I G. 14 C
S: UNLOADING
L: UNLOADING
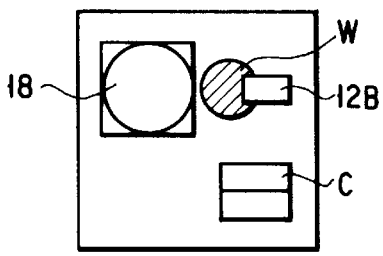
S: STOP
L: RETURNING
F I G. 15 A
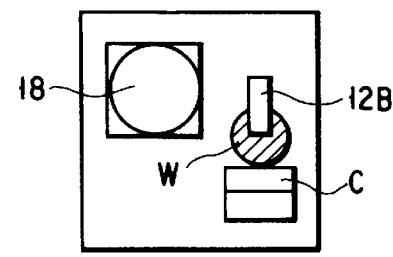
S: STOP
L: RETURNING
F I G. 15 B
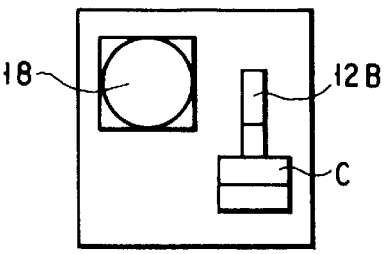
S: STOP
L: RETURNING
F I G. 15 C
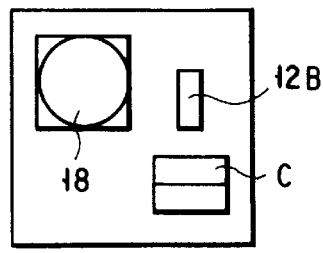
S: STOP
L: STOP
F I G. 15 D

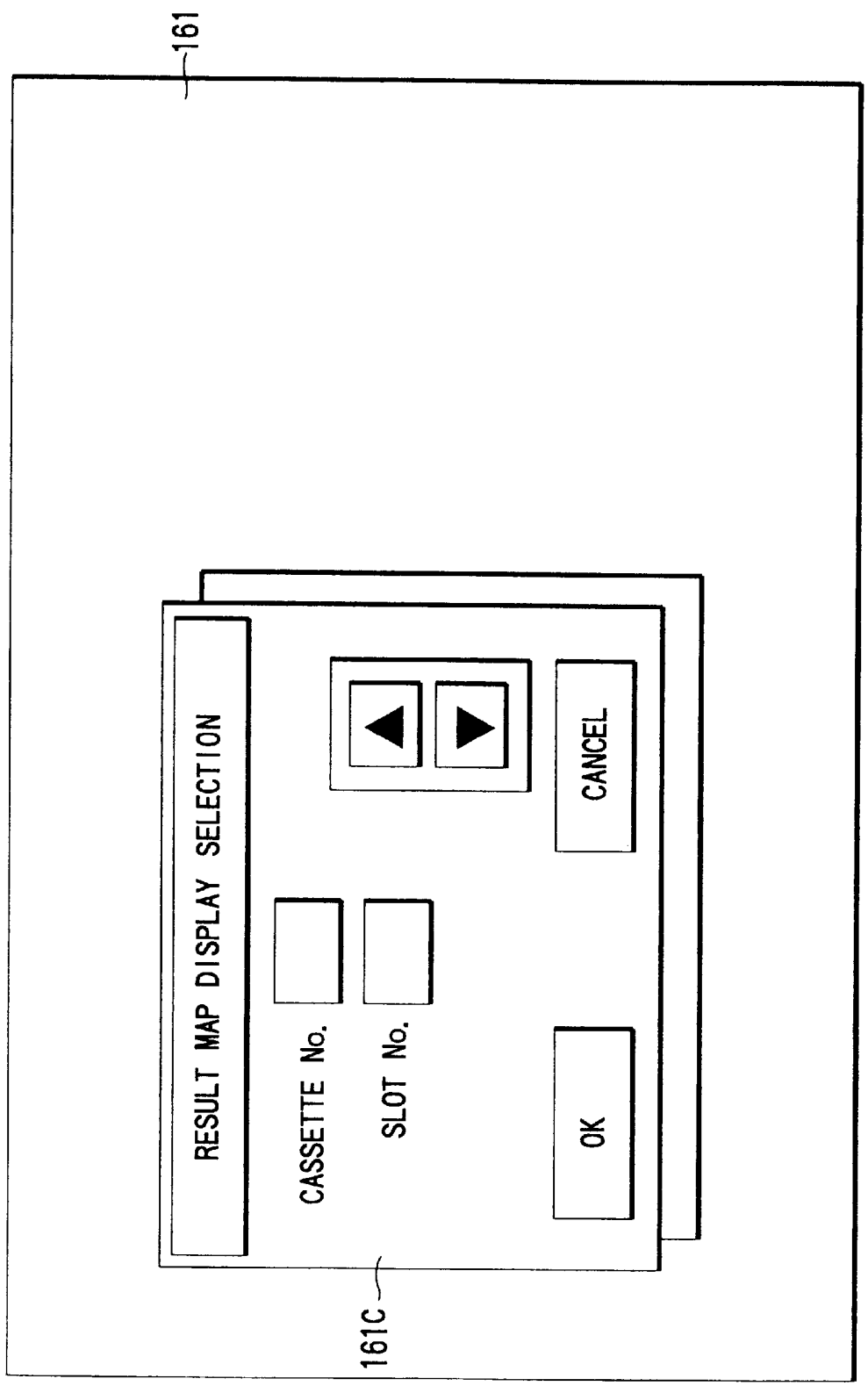
F I G. 16

CHANNEL TOTALIZATION

| Ch. No | PASS | FAIL | TOTAL | YIELD |
|--------|------|------|-------|-------|
|        |      |      |       |       |
|        |      |      |       |       |
|        |      |      |       |       |
|        |      |      |       |       |
|        |      |      |       |       |
|        |      |      |       |       |
|        |      |      |       |       |
|        |      |      |       |       |

WAFER DURING MEASUREMENT

LOT

UP ▲  DOWN ▼  OK

FIG. 19

WAFER TOTALIZATION

| WAFER | PASS | FAIL | TOTAL | YIELD | WAFER ID |
|-------|------|------|-------|-------|----------|
|       |      |      |       |       |          |
|       |      |      |       |       |          |
|       |      |      |       |       |          |
|       |      |      |       |       |          |
|       |      |      |       |       |          |
|       |      |      |       |       |          |
|       |      |      |       |       |          |
|       |      |      |       |       |          |

UP ▲  DOWN ▼  OK

FIG. 20

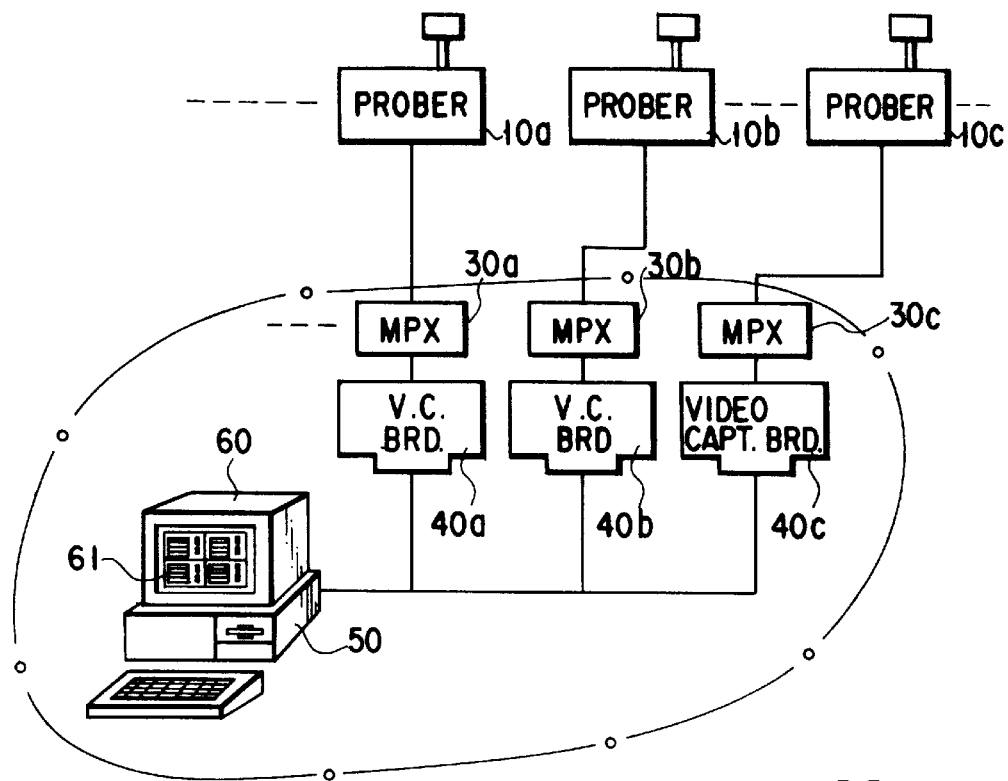
FIG. 23
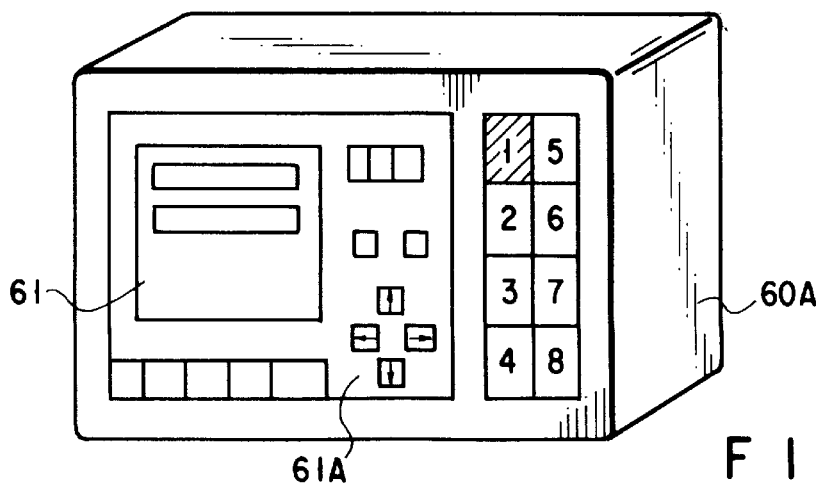
FIG. 24
```
          P P
        P F F P P P
  F . . . . . . . . . P
  P . . . . . . . . . . P
  P . . . . . . . . . . P
  P . . . . . . . . . . P
```
FIG. 25
(PRIOR ART)

INSPECTION APPARATUS WITH REAL TIME DISPLAY

BACKGROUND OF THE INVENTION

The present invention relates to an inspection apparatus for electrically inspecting an inspection target such as a semiconductor element formed on a semiconductor wafer, and a liquid crystal device.

A conventional inspection apparatus, e.g., a probe apparatus for electrically inspecting a semiconductor element formed on a semiconductor wafer, is constituted by a loader section having a cassette table portion for placing a semiconductor wafer stored in a cassette and forceps for conveying a semiconductor wafer in this cassette, a prober section for inspecting the semiconductor wafer conveyed via the forceps of the loader section, a controller for controlling the prober and loader sections, and a display device also serving as an operation panel for operating the controller.

The prober section comprises a movable main chuck for placing the semiconductor wafer thereon, and an alignment mechanism for aligning the semiconductor wafer placed on the main chuck to an inspection position. The prober section has a probe card supported by the top wall portion of upper casing above the main chuck, and the probe card has a plurality of probe needles for electrically inspecting the semiconductor wafer aligned by the alignment mechanism. On this top wall, a test head is arranged to be turnable between inspection and non-inspection positions. When the test head turns to the inspection position above the prober section, the probe card and a tester arranged outside the apparatus are electrically connected via the test head, and a predetermined signal from the tester is exchanged via the probe card between the tester and the pad or electrodes of a semiconductor element, such as an IC chip, formed on the semiconductor wafer on the main chuck, electrically inspecting the IC chips by the tester in sequence.

In checking the inspection results of respective IC chips of the semiconductor wafer having inspected by the prober section, a nondefective (PASS) P or a defective (FAIL) F is printed for each IC chip on a printing sheet by using, e.g., a mapping printer connected to the tester in accordance with the arrangement of the IC chips on the semiconductor wafer in units of rows, as shown in FIG. 25. As for a semiconductor wafer during inspection, each time inspection of IC chips on one row is completed, P or F is printed on a printing sheet in accordance with the arrangement of the IC chips on the semiconductor wafer in units of rows.

In the conventional probe apparatus, however, since the prober section is almost entirely covered with the test head during inspection of the semiconductor wafer, and the loader section is covered with a cover or the like, the state and location of the inspection target such as a semiconductor wafer cannot be known. In addition, the state of the semiconductor wafer (to be referred to as "wafer status" hereinafter) inside the probe apparatus, e.g., whether the semiconductor wafer is being inspected on the main chuck, cannot be known, either.

In the conventional inspection apparatus, since the inspection result of each inspected semiconductor wafer must be printed on a printing sheet by the mapping printer, a special mapping printer and consumables such as a printing sheet are required. Further, when the inspection result of a desired semiconductor wafer is to be searched for, a large number of printing sheets must be turned over one by one. Even if the inspection result of the desired semiconductor wafer is found, since P and F are printed as nondefectives and defectives, it is difficult to visually recognize the distribution state of the nondefectives and defectives, the yield, and the like by intuition.

BRIEF SUMMARY OF THE INVENTION

It is a main object of the present invention to provide an inspection apparatus capable of grasping in real time the wafer status such as the inspection situation and location of an inspection target inside an apparatus main body even during inspection.

It is another object of the present invention to provide an inspection apparatus which requires no printer or consumables, can easily retrieve the inspection result of an inspection target within a short time, and can visually provide the inspection results, such as the distribution state of nondefectives and defectives and the yield, within a short time by intuition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1 to 3 show a probe apparatus according to an embodiment of the present invention, in which FIG. 1 is a perspective view, FIG. 2 is a partially cutaway side view showing this apparatus, and FIG. 3 is a cutaway plan view schematically showing the top portion of this apparatus;

FIGS. 7A and 7B are views respectively showing a state wherein the position of loading forceps changes in the loader and stage states displayed on the wafer window of the display screen;

FIGS. 8A and 8B are views respectively showing a state wherein the position of a wafer conveyed by the loading forceps changes in the loader and stage states displayed on the wafer window of the display screen;

FIGS. 9A and 9B are views respectively showing a state wherein the position of the wafer conveyed by the loading forceps changes in the loader and stage states displayed on the wafer window of the display screen;

FIGS. 12A and 12B are views respectively showing a state wherein the loader and stage states displayed on the wafer window of the display screen change;

FIGS. 13A, 13B, and 13C are views respectively showing a state wherein the loader and stage states displayed on the wafer window of the display screen change;

FIGS. 14A, 14B, and 14C are views respectively showing a state wherein the loader and stage states displayed on the wafer window of the display screen change;

FIGS. 15A, 15B, 15C, and 15D are views respectively showing a state wherein the loader and stage states displayed on the wafer window of the display screen change;

FIG. 16 is a plane view showing a display screen on which a result map display selection window is displayed;

FIG. 19 is a plane view showing a display screen on which a channel totalization window in a status screen is displayed;

FIG. 20 is a plane view showing a display screen on which a wafer totalization window in a status window is displayed;

FIG. 23 is a view showing the arrangement of the system of an inspection apparatus according to another embodiment of the present invention;

FIG. 24 is a perspective view showing a display device capable of switching and displaying an operation panel, wafer status, and the like on the display screen in units of probe apparatuses; and FIG. 25 is a view showing the nondefective-defective map of IC chips printed by a mapping printer according to the prior art.

DETAILED DESCRIPTION OF THE INVENTION

A probe apparatus as an inspection apparatus according to an embodiment will be described below with reference to FIGS. 1 to 24.

Figure 1:
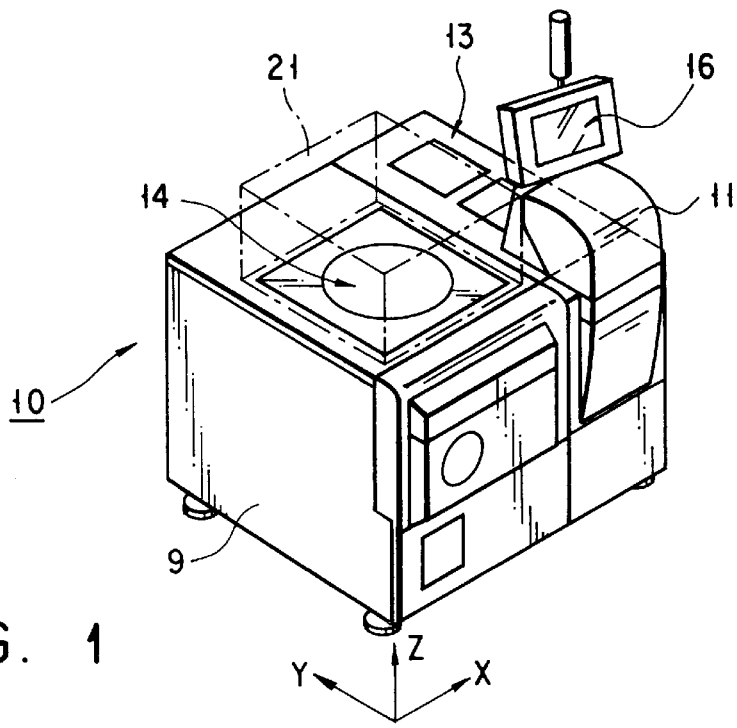
Figure 2:
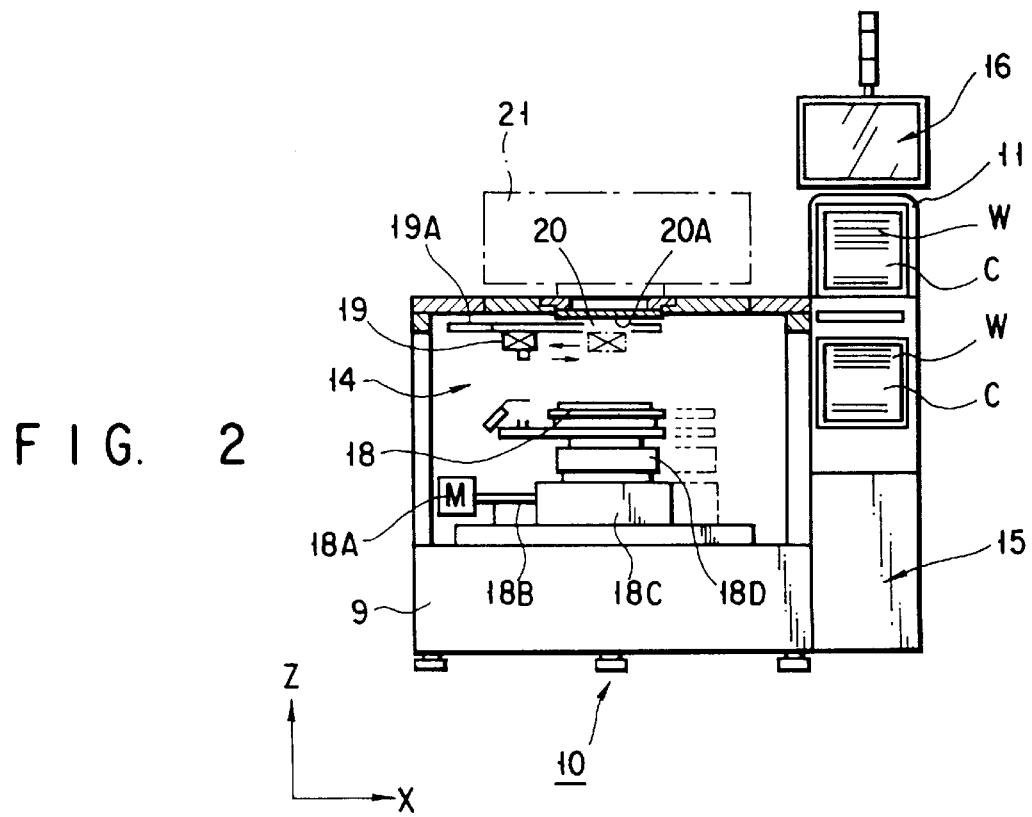

As shown in FIGS. 1 to 3, a probe apparatus or prober 10 has a casing 9. In this casing 9, a loader section 13, a prober section 14, and a controller 15 are arranged. The loader section 13 comprises a table portion, i.e., a support means 11 for supporting or placing vessels, i.e., cassettes C each horizontally storing a plurality of inspection targets or semiconductor wafers therein in the vertical direction at a constant interval, and a forceps assembly 12 as a convey means for conveying a semiconductor wafer W from and to the cassette. The prober section 14 inspects the semiconductor wafer W conveyed via the forceps assembly 12 of the loader section 13. The controller 15 controls the prober section 14 and the loader section 13. Outside the casing 9, a display device 16 also serving as an operation panel for operating the controller 15 is arranged.

Under the control of the controller 15, the support means 11 vertically moves the cassette in a step-wise manner to take out the semiconductor wafers from the cassette with the forceps assembly 12 and store them in the cassette.

The loader section 13 comprises a sub-chuck 17 for performing so-called prealignment in which the orientation of the semiconductor wafer W is adjusted on the basis of an orientation flat. The forceps assembly 12 is constituted by loading forceps 12A for conveying the semiconductor wafer W to the prober section 14 after taking out the semiconductor wafer from the cassette and prealigning it by the sub-chuck 17, and unloading forceps 12B for returning the inspected semiconductor wafer into the cassette.

The prober section 14 has a main chuck 18 and an alignment mechanism 19. The main chuck 18 places the semiconductor wafer W thereon and is movable in the X, Y, Z, and θ directions. The alignment mechanism 19 has an alignment bridge 19A for accurately aligning the semiconductor wafer W placed on the main chuck 18 to an inspection position, and the like. In the prober section 14, a probe card 20 with a plurality of probe needles 20A for electrically inspecting the semiconductor wafer W aligned by the alignment mechanism 19 is further arranged at the top wall portion of the casing above the main chuck. On this top wall, a test head 21 is arranged to be swingable between the inspection and non-inspection positions. When the test head 21 is swung in the inspection position above the prober section 14, the probe card 20 and a tester (not shown) arranged outside the apparatus are electrically connected via the test head 21, and a predetermined signal from the tester is exchanged via the probe card 20 between the tester and the pads or electrodes of a semiconductor element, such as an IC chip, formed on the semiconductor wafer W mounted on the main chuck 18, electrically inspecting the IC chips by the tester in sequence.

Figure 4:
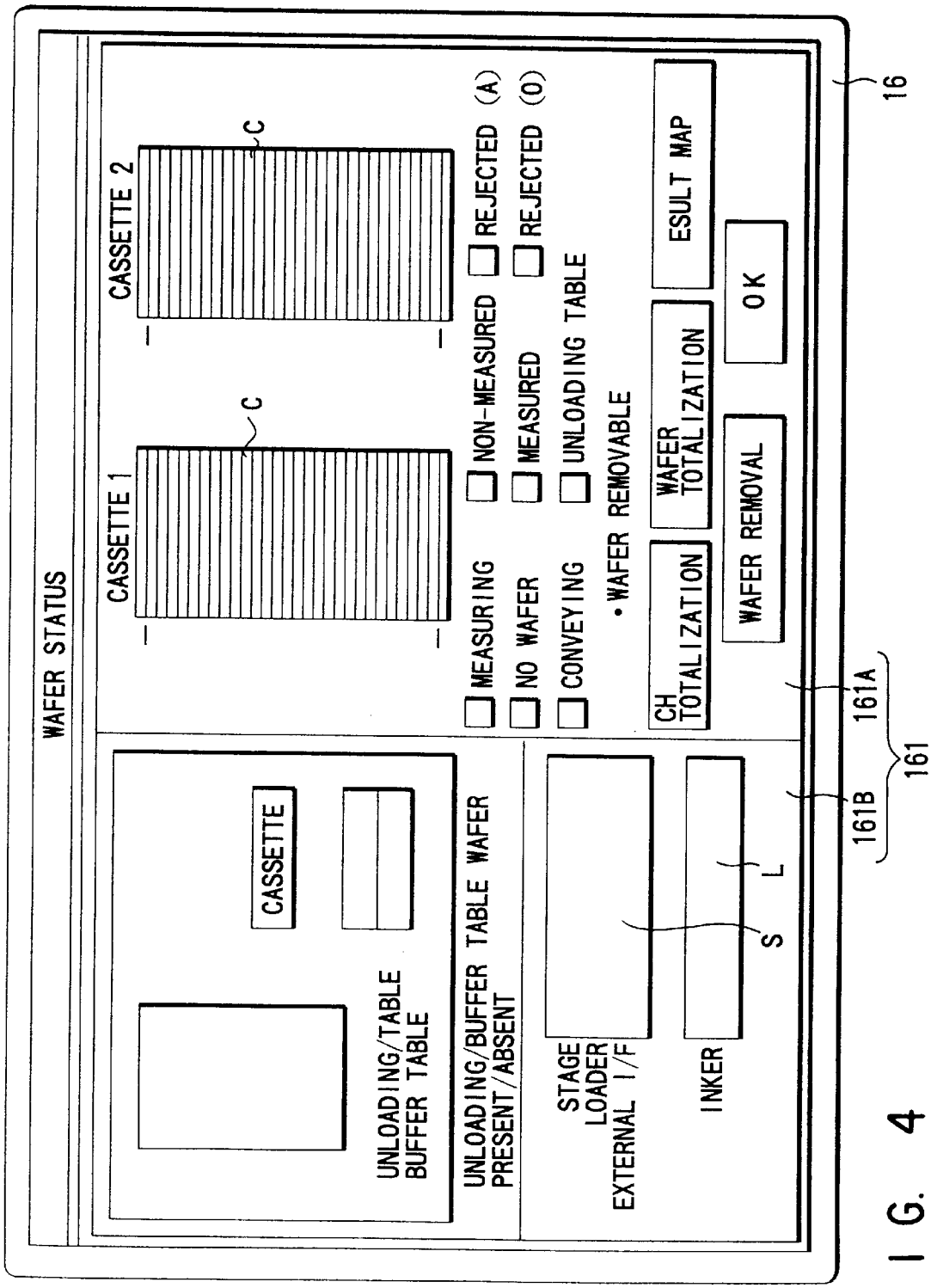
FIG. 4 is a front view showing the display screen or touch screen of a display device as a component of the probe apparatus as an inspection apparatus according to the embodiment of the present invention.
Figure 5:
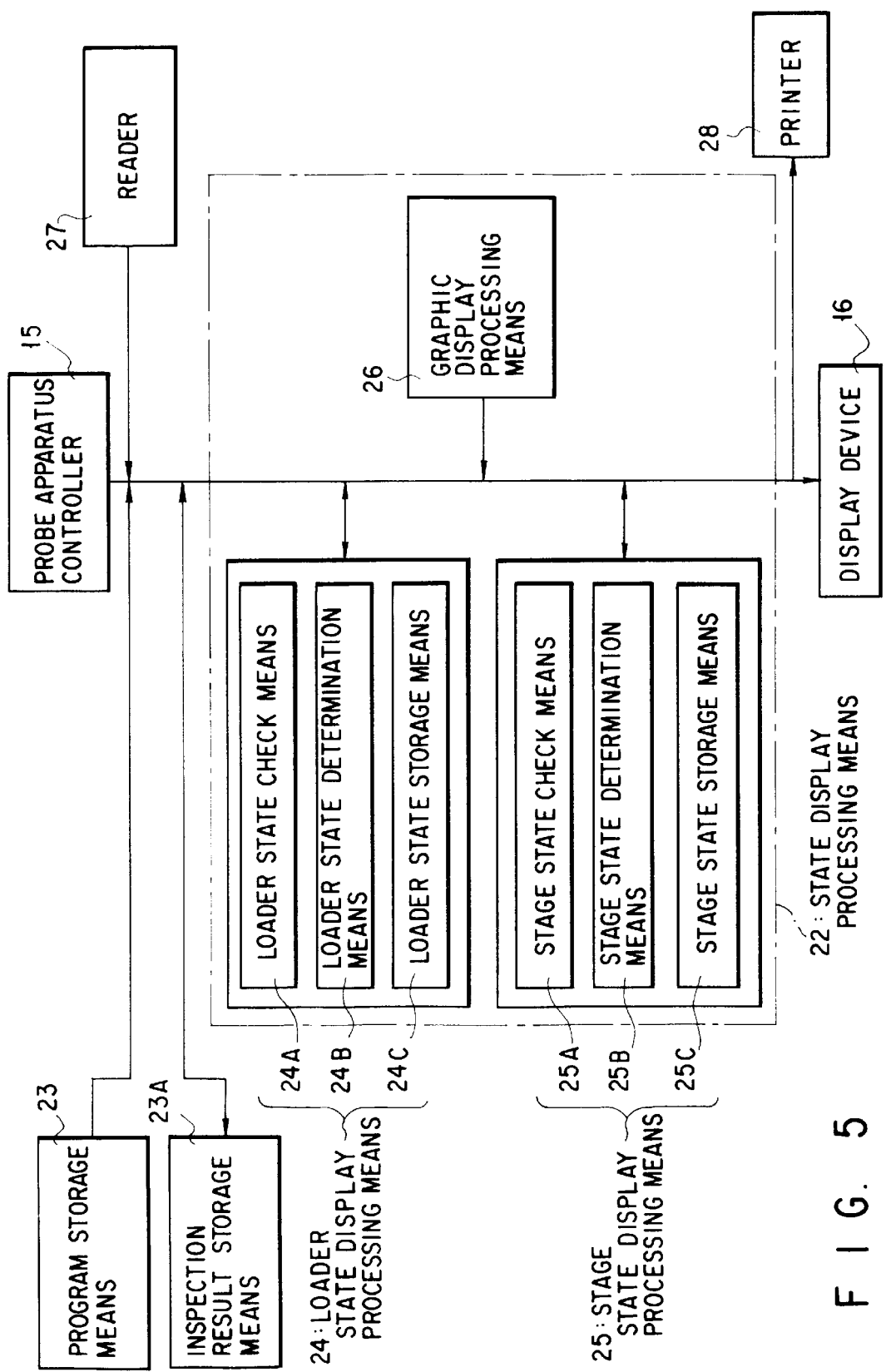
FIG. 5 is a block diagram showing a state display processing means for displaying wafer status displayed on the display screen shown in FIG. 4.

The probe apparatus 10 has a state (or status) display processing means 22 for displaying the state (status) of the semiconductor wafer W (wafer status) including the location and inspection progress situation of the semiconductor wafer W on the display device 16 during inspection, as shown in FIG. 5. The state display processing means 22 operates in accordance with the processing procedure of a wafer status display processing program stored in a program storage means 23 constituted by a RAM, a ROM, or the like. The state display processing means 22 is constituted by a loader state display processing means 24 for checking the state of the semiconductor wafer W in the loader section 13 and processing and displaying this state, a stage state (or status) display processing means 25 for checking the state of the semiconductor wafer W on the main chuck 18 as a measurement stage, i.e., the state of the inspection target in the prober section and processing and displaying this state, and a graphic display processing means 26 for performing graphic display processing with respect to the wafer status on the basis of processed signals from these means 24 and 25. The graphic display processing means 26 displays the cassettes C, the semiconductor wafers W, the forceps assembly 12, the main chuck 18, and the alignment mechanism 19 in the probe apparatus 10, and the like on a display screen 161 shown in FIG. 4, and if the wafer status changes, displays the changed state. The inspection results of the respective semiconductor wafers W are sequentially stored in an inspection result storage means 23A constituted by a RAM or the like and displayed as a cassette map (see FIG. 4) or a wafer map (see FIGS. 17 and 18) on the display screen 161 via the graphic display processing means 26, as needed. Therefore, the state display processing means 24 and 25 and the graphic display processing means 26 function in cooperation with a central processing unit (CPU) in the controller 15 and various memories.

The loader state display processing means 24 comprises detection sensors (not shown) respectively arranged in the cassette, the forceps assembly, and the moving path of the forceps assembly, and the sub-chuck so as to detect the presence/absence of the semiconductor wafer to each slot of the cassette, the presence/absence of the semiconductor wafer on the forceps assembly, the presence/absence of the semiconductor wafer at each position of the forceps assembly, the presence/absence of the wafer on the sub-chuck, and the like. For example, the loader state display processing means 24 comprises a loader state check means 24A for checking the loader state of the semiconductor wafer W on the basis of a detection result from a touch sensor, a loader state determination means 24B for determining whether a check signal varies, and a loader state storage means 24C prestoring the contents of a plurality of loader states. The graphic display processing means 26 reads out data corresponding to the determination result of the loader state determination means 24B from the loader state storage means 24C to execute graphic display processing, thereby graphically displaying a change in loader state on the display screen 161 of the display device 16. The stage state display processing means 25 comprises a stage state check means 25A for checking the stage state of the semiconductor wafer W on the basis of detection signals from detection sensors and the like so provided as to detect the presence/absence of the semiconductor wafer on the main chuck and the position of the alignment bridge, a stage state determination means 25B for determining whether a check signal varies, and a stage state storage means 25C prestoring the contents of a plurality of stage states. The graphic display processing means 26 reads out data corresponding to the determination result of the stage state determination means 25B from the stage state storage means 25C to execute graphic display processing, thereby graphically displaying a change in stage state on the display screen 161 of the display device 16.

A reader 27 and a color printer 28 are connected to the probe apparatus 10. The reader 27 optically reads a character, a bar code, and the like attached to or formed in each semiconductor wafer W in order to identify the semiconductor wafer W, and supplies the read signal to the CPU. As the reader 27, an OCR, a bar-code reader, or the like is used. The color printer 28 is connected together with the display device 16 to the output side of the state display processing means 22 so as to print the character such as the inspection result of each semiconductor wafer W and/or color mapping displayed on the display screen (to be described later).

For example, as shown in FIG. 4, the display screen 161 is divided into two portions to perform display on the two windows. The right window graphically displays the inspection situation of the semiconductor wafers W in the respective slots of the cassettes C, as a cassette map, in real time. The left window graphically displays, as a wafer map, the convey state and inspection situation of the semiconductor wafers W in real time, or the inspection result of the inspected semiconductor wafers or the semiconductor wafers W during inspection in real time. The former is called a first window 161A, and the latter is a second window 161B in the following description. Reference symbols used in the description of the probe apparatus 10 are directly applied to the semiconductor wafer W and constituent equipments of the probe apparatus 10 which are graphically displayed within the display screen 161.

As shown in FIG. 4, the first window 161A graphically displays the two cassettes C stored in the cassette table portion 11 and the semiconductor wafers W stored in the cassettes C, as a wafer map. In accordance with the wafer status of the semiconductor wafers W, separate colors are given to slots of the cassettes C in which semiconductor wafers W are positioned. For example, the wafer status includes "measuring", "non-measured", and "rejected (A)" states of the semiconductor wafer W (shown on the uppermost one of the three displayed stages below the cassettes in the first window 161A), "no wafer" (no semiconductor wafer exists from the beginning), "measured or tested", and "rejected (O)" states (shown on the middle stage), and "conveying" and "unloading table" states (shown on the lower stage), which states are represented with characters. The respective wafer states have □ displayed in different colors on the left sides of the characters. Each slot of the cassette C is displayed in the color of a corresponding state. The current states of the semiconductor wafers W in the cassettes C can be visually recognized at once.

Figure 17:
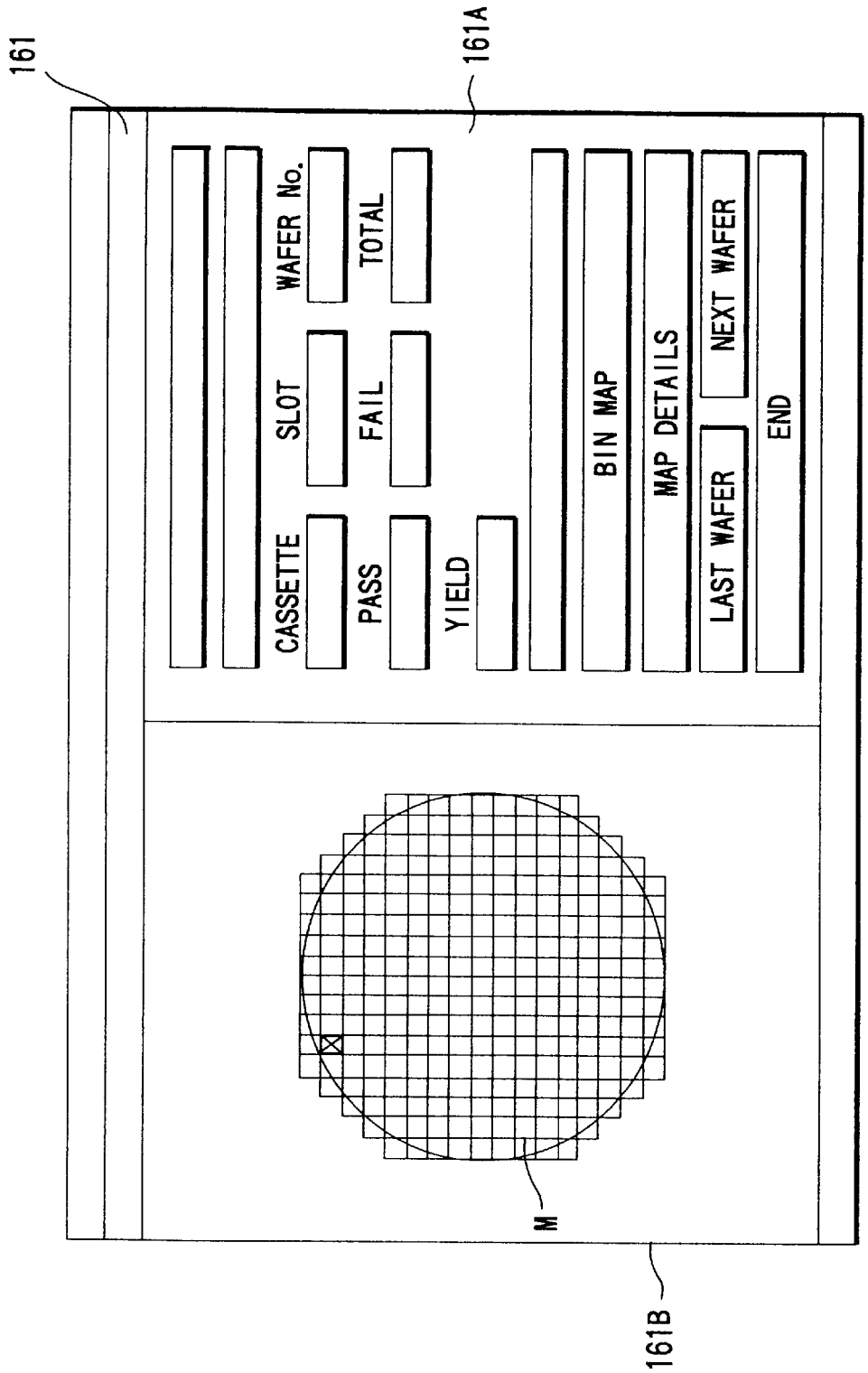
FIG. 17 is a plane view showing a display screen on which a result map illustrating a result map of a semiconductor wafer is displayed.

For example, □ for the "measuring" state is displayed in bright yellow, □ for the "non-measured" state is in bright green, □ for the "measured" state is in bright blue, □ for the "conveying" state is in bright sky blue, □ for the "no wafer" state is in white, □ for the "rejected (A)" state is in bright red, □ for the "rejected (O)" state is in bright purple, and the like. When a bright-blue slot having being subjected to measurement in the cassette C is touched, the wafer map is directly displayed on the second window 161B, as shown in, e.g., FIG. 17 (a window in FIG. 17 is displayed by touching a "result map" key displayed in FIG. 4, to be described later), and the inspection result is displayed on the first window 161A such that a nondefective and a defective are respectively represented by PASS and FAIL. Further, the numbers of nondefectives and defectives, and the like can be displayed.

When a certain slot in the cassette C is displayed in bright yellow representing the "measuring" state, this represents the wafer state from a state wherein the semiconductor wafer W is supported by support pins (not shown), the support pins are moved down in this state, and the semiconductor wafer is placed on the main chuck 18 to start measurement (marking) of the first IC chip to a state wherein measurement of the last IC chip is completed. Bright green for the "non-measured" state represents a state wherein the semiconductor wafer W exists in the slot. Bright sky blue for the "conveying" state represents the wafer state from a state wherein the loading forceps 12A contact the semiconductor wafer W in order to take out the wafer from the cassette C to a state wherein the semiconductor wafer W is transferred onto the support pins. Bright blue for the "measured" state represents a state wherein measurement is normally completed and the wafer is unloaded. Bright red for the "rejected (A)" state represents a state wherein the semiconductor wafer W is rejected in alignment and unloaded without executing alignment. Bright purple for the "rejected (O)" state represents a state wherein the semiconductor wafer W is rejected in a process except for alignment and unloaded. The "unloading table" state represents a state wherein the semiconductor wafer W is conveyed to the unloading table.

On the window 161A, a "CH totalization" key, a "wafer totalization" key, and a "result map" key are arrayed in one line below the above state display items, and a "wafer removal" key and an "end or OK" key are arrayed in one line below the above state display items. Although these keys and a key (to be described later) may be, e.g., touch buttons provided to the touch screen of the display device, they are constituted by touch key or switches displayed on the window in this preferred embodiment.

The second window 161B graphically displays the conveying state of the semiconductor wafer W between the cassette C and the main chuck 18, the location of the semiconductor wafers W (except for a location in the cassette), and the state (alignment or measurement) of the semiconductor wafer W in the prober section 14. At the same time, the second window 161B graphically displays the cassette C, the unloading table, the loading and unloading forceps 12A and 12B, the main chuck 18, the alignment bridge 19A, and the like. The pieces of stage and loader status information are displayed with characters at corresponding display portions S and L below the graphic display portion by reading out character data from the respective state storage means 24C and 25C.

For example, when the second window 161B displays a state wherein the semiconductor wafer W exists in the loading forceps 12A, this represents the wafer state from a state wherein the semiconductor wafer W is taken out from the cassette C immediately before prealignment to a state wherein the semiconductor wafer W is transferred onto the main chuck 18 immediately after the prealignment. A state wherein the semiconductor wafer W exists on the main chuck 18 represents the wafer state from a state wherein the semiconductor wafer W is transferred onto the main chuck 18 by the loading forceps 12A to a state wherein the unloading forceps 12B remove the semiconductor wafer W from the main chuck 18 and return it to the home position. A state wherein the semiconductor wafer W exists on the unloading forceps 12B represents the wafer state from the state wherein the unloading forceps 12B remove the semiconductor wafer W from the main chuck 18 and return it to the home position to a state wherein the semiconductor wafer W is stored in the cassette C (or the unloading table).

The respective constituent equipments are displayed in different colors to facilitate visual identification of the respective constituent equipments. For example, the semiconductor wafer W is displayed in bright green, the cassette C is in bright blue, the loading forceps 12A and 12B are in white, the main chuck 18 is in yellow (background is in bright black), and the alignment bridge is in black. When the semiconductor wafer W exists on the unloading table, □ for this table is displayed in blue representing "presence", and the slot number of the semiconductor wafer W is displayed; when no semiconductor wafer W exits, □ for this table is displayed in white representing "absence"; and when the semiconductor wafer W is removed, □ for this table is displayed in white, and the slot number of the semiconductor wafer W is displayed.

Figure 6:
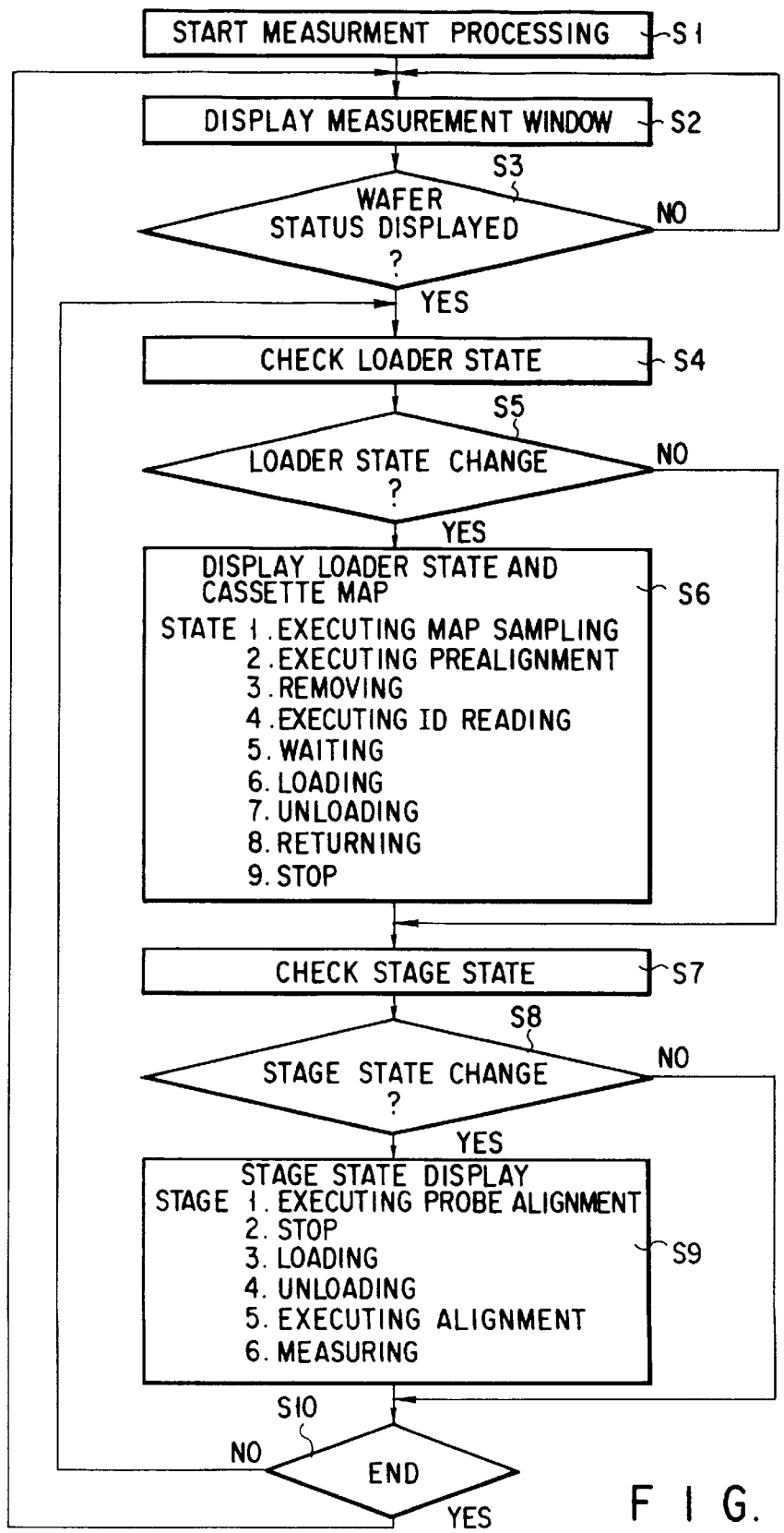
FIG. 6 is a flow chart for displaying the wafer status displayed on the display screen shown in FIG. 4.

The pieces of wafer status information of the semiconductor wafer W are displayed on the display screen 161 after the state display processing means 22 functions in accordance with a wafer status display processing program created based on, e.g., a flow chart shown in FIG. 6. The display screen is switched from the measurement window to the wafer status display window by selecting a "wafer status" key (not shown) from operation keys displayed on the display screen and touching it.

More specifically, when the probe apparatus 10 starts measurement of the semiconductor wafer W (step 1), the display screen 161 displays the measurement window (step 2). It is checked based on a signal whether a command signal for displaying the wafer status is input. When the "wafer status" key is touched, it is determined that the command signal is input (step 3), and the display screen 161 is switched from an operation panel window for operating the probe apparatus 10 to the status display window. At this time, when no command for displaying the wafer status is input, the flow returns to step 2 to keep displaying the measurement window.

In step 3, if there is the command for displaying the wafer status, the wafer status window shown in FIG. 4 is displayed. The loader state determination means 24B then starts processing, and the loader state check means 24A checks the loader state (step 4). Thereafter, the loader state determination means 24B checks whether the loader state has changed (step 5). If the loader state determination means 24B determines that the loader state has changed, a loader state corresponding to the changed content (one of 1. "executing map sampling", 2. "executing prealignment", 3. "removing", 4. "executing ID reading", 5. "standby", 6. "loading", 7. "unloading", 8. "returning", and 9. "stop"; e.g., 1. "executing map sampling") is read out from the loader state storage means 24C and displayed with characters at the loader status display portion L on the display screen 161. At the same time, the graphic display processing means 26 performs graphic display processing with respect to the loader state, and the obtained image is graphically displayed on the display screen 161 (step 6). If the loader state display processing means 24B determines that the loader state does not change, the current image is kept displayed.

After loader state display processing, the stage state determination means 25B starts processing, and the stage state check means 25A checks the stage state (step 7). Thereafter, the stage state determination means 25B checks whether the stage state has changed (step 8). If the stage state determination means 25B determines that the stage state has changed, a stage state corresponding to the changed content (one of 1. "executing probe alignment", 2. "stop", 3. "loading", 4. "unloading", 5. "executing alignment", and 6. "measuring"; e.g., "executing probe alignment") is read out from the stage state storage means 25C and displayed with characters at the stage status display portion S on the display screen 161 (in this case, the stage status display portion S is in the same place as that of the loader status display portion L). At the same time, the graphic display processing means 26 performs graphic display processing with respect to the stage state, and the obtained image is graphically displayed on the display screen 161 (step 9). If the stage state determination means 25B determines that the stage state does not change, the current image is kept displayed, and it is checked whether display of the wafer status is ended (step 10). If it is determined that the display command of the wafer status is not ended, the flow returns to step 4 to repeatedly execute the respective processes from step 4.

The series of processes are executed instantly. Each time the wafer status changes, the changed status is displayed on the display screen 161 in real time. When an "end" key on the first window 161A of the display screen 161 is touched, a command signal for ending the wafer status display is input to end the wafer status display. The flow returns to step 2 to display the measurement window. If the "end" key is not operated, the flow returns again to step 4.

Next, variations in wafer status display of the semiconductor wafer W by the state display processing means 22 will be explained in detail with reference to FIGS. 7 to 15.

For example, if mapping sampling is executed in the loader section 13, "executing map sampling" is displayed at the loader status display portion L located at the lower portion of the second window 161B (which also applies to the following description; FIG. 7A). Then, the loading forceps 12A are driven to enter the cassette C in order to remove the semiconductor wafer W, this situation is graphically displayed in real time, and this state is displayed as "removing" at the loader status display portion L (FIG. 7B). During this operation, in the prober section 14, alignment of the probe needles 20A is executed, and this state is displayed as "executing probe alignment" at the stage status display portion S of the display screen 161, as shown in FIGS. 7A and 7B.

As shown in FIG. 8A, in the loader section 13, the loading forceps 12A remove the semiconductor wafer W from the cassette C, this situation is graphically displayed on the display screen 161 in real time, and this state is displayed as "executing prealignment" at the loader status display portion L. After prealignment, the loading forceps 12A convey the semiconductor wafer W to the reader 27 of the loader section 13, and the reader 27 optically reads a character, a bar code, and the like as the identification code of the semiconductor wafer W. This situation is graphically displayed in real time, and this state is displayed as "executing ID reading" at the loader status display portion L (FIG. 8B). During this operation, in the prober section 14, the respective constituent equipments stop their operations, and this situation is displayed as "stop" at the stage status display portion S, as shown in FIG. 8B.

In the loader section 13, after the semiconductor wafer W is identified by the reader 27, the loading forceps 12A wait at a predetermined position in order to place the semiconductor wafer W on the main chuck 18, this situation is graphically displayed in real time, and "waiting" is displayed at the loader status display portion L, as shown in FIG. 9A. During this operation, the main chuck 18 is kept stopped, and "stop" is displayed at the stage status display portion S, as shown in FIG. 9A. Then, as shown in FIG. 9B, the operation shifts to an operation of placing the semiconductor wafer W on the main chuck 18, and "loading" is displayed at the stage and loader status display portions S and L, respectively.

Figure 10A:
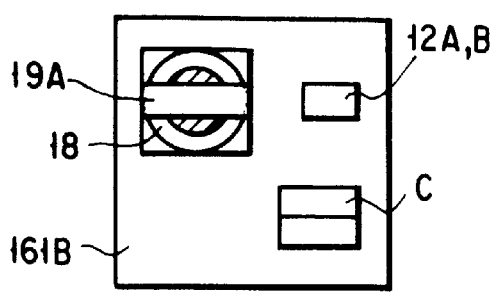
FIGS. 10A, 10B, 10C, and 10D are views respectively showing a state wherein the position of the forceps changes in wafer inspection in the loader and stage states displayed on the wafer window of the display screen.
Figure 10B:
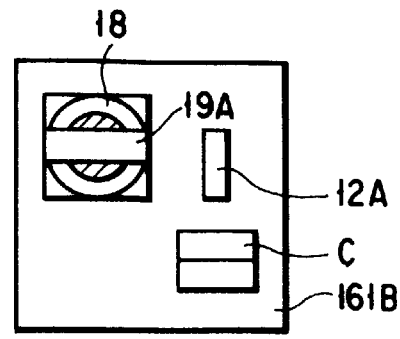
Figure 10C:
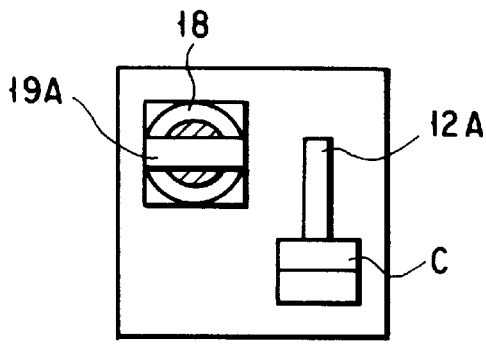
Figure 10D:
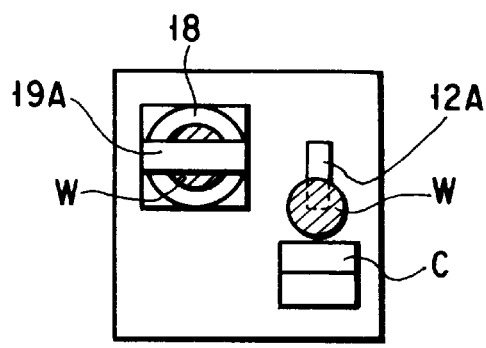

The semiconductor wafer W is placed on the main chuck 18. In the loader section 13, immediately after the semiconductor wafer W is transferred from the loading forceps 12A onto the main chuck 18, "stop" is displayed at the loader status display portion L, as shown in FIG. 10A. When the loading forceps 12A move to the cassette C in order to take out a semiconductor wafer W to be inspected next, this situation is graphically displayed in real time, and this state is displayed as "removing" at the loader status display portion L, as shown in FIGS. 10B and 10C. When the loading forceps 12A take out the semiconductor wafer W from the cassette C to execute prealignment on the sub-chuck 17, this situation is graphically displayed in real time, and this state is displayed as "executing prealignment" at the loader status display portion L, as shown in FIG. 10D. During this operation, in the prober section 14, the alignment bridge 19A moves to a position above the main chuck 18 to execute alignment of the semiconductor wafer W. This situation is graphically displayed in real time, and this state is displayed as "executing alignment" at the stage status display portion S, as shown in FIGS. 10A to 10D.

Figure 11:
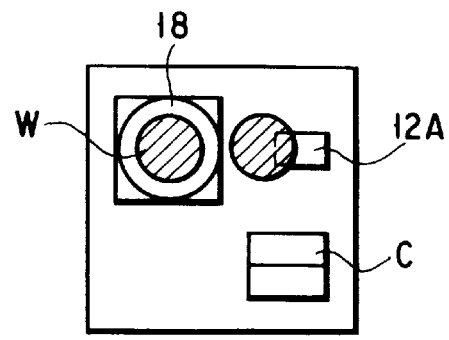
FIG. 11 is a view showing a state wherein the loader and stage states displayed on the wafer window of the display screen change.

After alignment, the alignment bridge 19A returns to the original position to execute measurement or inspection of the semiconductor wafer W. This situation is graphically displayed without displaying the alignment bridge 19A, and "measuring or inspecting" is displayed at the stage status display portion S, as shown in FIG. 11. On the other hand, in the loader section 13, prealignment and identification of the next semiconductor wafer W are completed, and "waiting" is displayed at the loader status display portion L.

Upon completion of inspection in the prober section 14, the main chuck 18 moves to a position where the semiconductor wafer W is received from the loader section 13. In the loader section 13, the unloading forceps 12B are driven to unload the inspected semiconductor wafer W from the main chuck 18. As shown in FIG. 12A, this situation is graphically displayed in real time, and this state is displayed as "unloading" at the stage and loader status display portions S and L, respectively. After the unloading forceps 12B unload the semiconductor wafer W, the loading forceps 12A are driven to load the next semiconductor wafer W during waiting to the main chuck 18. This situation is graphically displayed in real time, and this state is displayed as "loading" at the stage and loader status display portions S and L, respectively.

In the loader section 13, upon completion of unloading the first semiconductor wafer W and loading the next semiconductor wafer W, the unloading forceps 12B convey the semiconductor wafer W and return it to the original position or slot in the cassette C. This situation is graphically displayed in real time, and this state is displayed as "returning" at the loader status display portion L, as shown in FIGS. 13A to 13C. During this operation, in the prober section 14, the alignment bridge 19A moves to a position above the main chuck 18 to execute alignment of the semiconductor wafer W. This situation is graphically displayed in real time, and this state is displayed as "executing alignment" at the stage status display portion S, as shown in FIGS. 13A to 13C.

The above-mentioned inspection is executed for all the semiconductor wafers W in the cassette. In the loader section 13, when a semiconductor wafer W during inspection on the main chuck 18 is the last one, it is displayed at the loader status display portion L that a semiconductor wafer W one before the last wafer is being returned, as shown in FIG. 14A. After returning, "stop" is displayed, as shown in FIG. 14B. During this operation, the measuring state on the main chuck 18 is graphically displayed in real time, and "measuring" is displayed at the stage status display portion S, as shown in FIGS. 14A and 14B. Upon completion of inspecting the last semiconductor wafer W, the unloading forceps 12B are driven to unload the inspected semiconductor wafer W from the main chuck 18. As shown in FIG. 14C, this situation is graphically displayed in real time, and this state is displayed as "unloading" at the stage and loader status display portions S and L, respectively.

While the semiconductor wafer W is unloaded from the main chuck 18 by the unloading forceps 12B and returned to the original position, this situation is graphically displayed in real time, and this state is displayed as "returning" at the loader status display portion L, as shown in FIGS. 15A to 15C. Upon completion of returning the semiconductor wafer W, "stop" is displayed at the loader status display portion L, as shown in FIG. 15D. In this manner, inspection of all the semiconductor wafers W in the cassettes C is completed. During the series of operations, "stop" is displayed at the stage status display portion S, as shown in FIGS. 15A to 15D.

Upon completion of inspecting all the semiconductor wafers W, if "end" on the first window 161A of the display screen 161 is touched, the display window returns to the measurement window.

Figure 18:
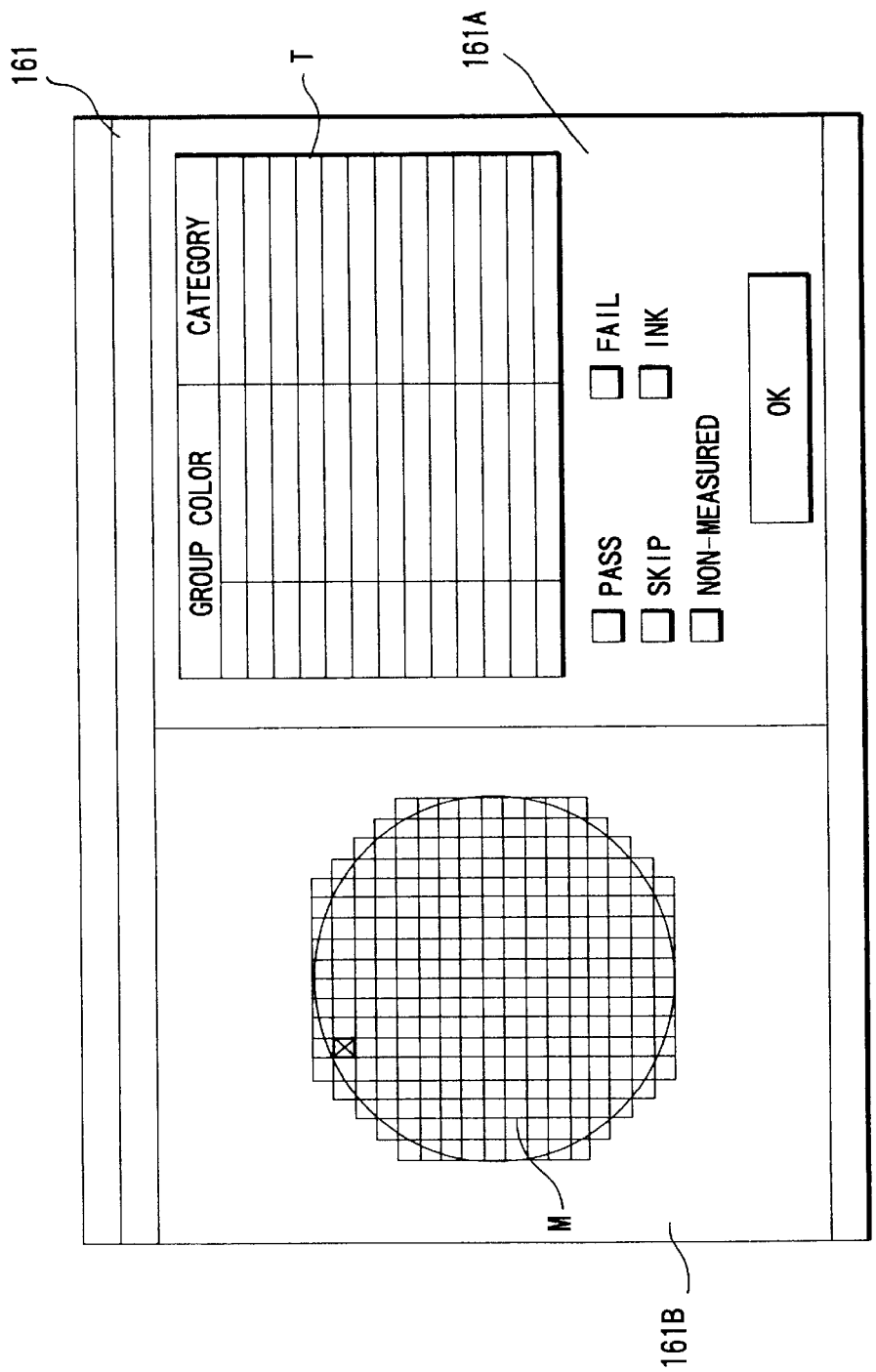
FIG. 18 is a plane view showing a display screen on which a result map illustrating inspection results of a semiconductor wafer is displayed.

If the inspection results of the inspected semiconductor wafers are to be obtained during the above operation, the "result map" key on the wafer status window shown in FIG. 4 is touched to display a result map display selection window 161C on the display screen 161 by the command signal, as shown in FIG. 16. The result map display selection window 161C allows the operator to input "cassette No." and "slot No." For example, when a rectangular blank on the right side of "cassette No." is designated by a touch operation, either of a "▲" key or a "▼" key is touched to scroll the cassette numbers, and the operation is stopped at a predetermined number, a command signal can be input to designate the desired cassette number. If an "OK" key is touched upon similar designation of a desired slot number after designation of the desired cassette number, the first window 161A displays items such as the cassette number, the slot number, the wafer number, and a nondefective/defective, and their numerical data, and the second window 161B displays a wafer map M of the corresponding semiconductor wafer. On the wafer map M, nondefectives and defectives of respective IC chips, and the like are displayed in different colors. Therefore, the operator can visually grasp the distribution state of nondefectives and defectives and the yield by intuition on the basis of the color distribution of the wafer map M on the display screen 161, and the details can be accurately obtained from the display items on the first window 161A. At the same time, in order to obtain the inspection results of semiconductor wafers in adjacent slots in the same cassette, if "last wafer" or "next wafer" is touched, the inspection result can be displayed by the command signal to obtain the inspection result of the semiconductor wafer. Further, in order to obtain the inspection results of the respective semiconductor wafers in units of categories, if a "BIN map" key is touched, a window shown in FIG. 18 is displayed on the display screen 161 by the command signal. The first window 161A displays a category table T, on which respective categories and the number of IC chips belonging to each category are displayed. The second window 161B displays the wafer map M, on which the respective IC chips are displayed in different colors using the colors of the respective categories of the table. If an "END or OK" key is touched upon confirming the categories, the current window returns to the original result map display window shown in FIG. 17 by the command signal. Further, if the "end" key is touched on the result map display window, the window returns to the measurement window.

If the "CH totalization" key shown in FIG. 4 is touched, a channel totalization window is displayed on the display screen 161 by the command signal, as shown in FIG. 19. This window displays a table of the channel number, a nondefective/defective belonging to a corresponding channel number, and the like. When the channel totalization result for a semiconductor wafer during measurement is to be confirmed, it can be confirmed by touching a "measuring wafer" key. In order to obtain a similar result for an inspected semiconductor wafer in the lot, if a "lot" key is touched, a totalization result having contents designated by the command signal is displayed. The display list can be changed by touching a ▲ key or a ▼ key. If an "end" key is touched upon confirming the above results, the current window returns to the original measurement window.

If the "wafer totalization" key shown in FIG. 4 is touched, a wafer totalization window is displayed on the display screen 161 by the command signal, as shown in FIG. 20. This window displays a table of the wafer number of an inspected semiconductor wafer, a nondefective/defective belonging to a corresponding wafer number, and the like. The display list can be changed by touching a ▲ key or a ▼ key. If an "END or OK" key is touched upon confirming the above results, the current window returns to the original measurement window. The wafer totalization table can be displayed on the display screen 161, and the channel totalization result of the semiconductor wafer can be confirmed.

The program storage means 23 of the probe apparatus 10 according to this embodiment stores the programs of a history mode for recording the operation history of the probe apparatus 10 and an error display mode for recording the operation and manipulation errors of the probe apparatus 10, in addition to the wafer status display program. Each program is selected from messages displayed on the display screen 161, similar to the wafer status display.

Figure 21:
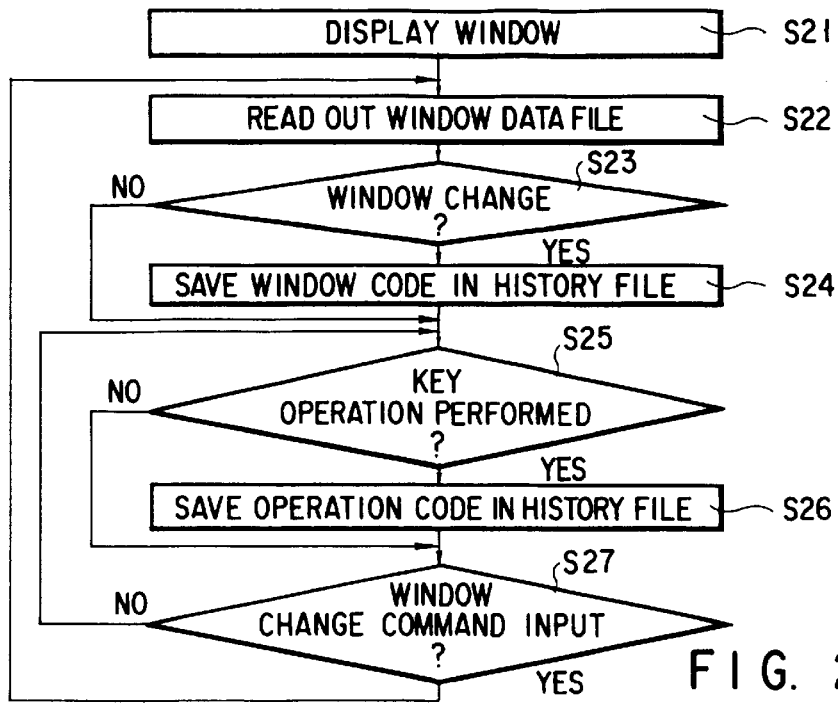
FIG. 21 is a flow chart for displaying the operation history of the probe apparatus and the like on the display screen.

The history mode is processed in accordance with a flow chart shown in FIG. 21. More specifically, after the window of the history mode is displayed on the display screen 161 on the basis of a command signal by an operation key (step 21), readout of an image data file is executed (step 22). A determination means checks whether the image data file has changed (step 23), and if YES, the changed window code is saved in a history file (step 24). Subsequently, it is checked whether the operation of the operation key is executed (step 25), and if YES, the operation code is saved in the history file (step 26). Thereafter, the determination means checks whether there is a change command for the display window (step 27). If NO, the flow returns to step 22 to repeat the above processes. Each time the image data file or the operation content of the operation key changes, the change is saved in the history file to store the operation history. On the other hand, if it is determined in step 23 that the image data file does not change, the flow jumps to step 25 to sequentially execute the processes in steps 25 to 27. In step 25, if it is determined that the execution contents of the operation key do not change, the flow jumps to step 27. The operation history of the probe apparatus 10 can be stored by repeating such a series of operations and can always be grasped by reading the history file. The history can be printed out by the printer 28 and can be used as reference data for a subsequent operation.

Figure 22:
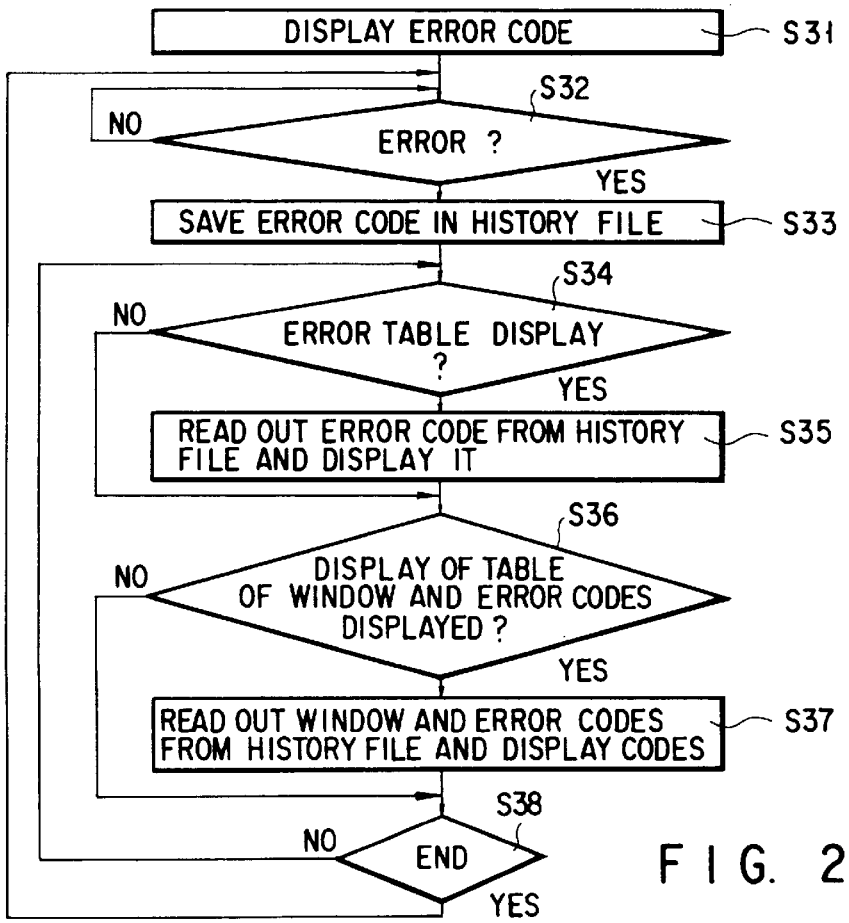
FIG. 22 is a flow chart for displaying the error display mode on the display screen.

The error display mode is processed in accordance with a flow chart shown in FIG. 22. More specifically, when the window of the error display mode is displayed on the display screen 161 (step 31), the determination means checks whether an operation error or the like is generated (step 32). If YES, the window and error codes are saved in the history file (step 33). It is checked on the basis of the command signal whether the error codes are displayed as a table (step 34), and if YES, the error codes are read out from the history file and displayed on the display screen 161 (step 35). Further, it is checked on the basis of the command signal whether a table of window and operation codes among the error codes is displayed (step 36), and if YES, the window and operation codes are read out from the history file to display the contents on the display window (step 37). Thereafter, it is checked on the basis of the command signal whether the error display mode is ended, and if NO, the flow returns to step 32 to repeat the above-mentioned processes in accordance with the presence/absence of an error. In step 34, if it is determined that no error table is displayed, the flow jumps to step 36 to execute the subsequent processes. In step 36, if it is determined that no table of the window and operation codes is displayed, the flow jumps to step 38 to end the error display or returns to step 32 to repeatedly execute the error display processes. The error history of the probe apparatus 10 can be stored by repeating such series of operations and can always be grasped by reading the history file. The history can be printed out by the printer 28 and can be used as reference data for a subsequent operation.

As described above, according to this embodiment, the state of the semiconductor wafer W including the location and inspection progress situation of the semiconductor wafer W can be graphically displayed as the wafer status on the display screen 161 in real time. Therefore, even if the interior of the probe apparatus 10 cannot be directly seen, the inspection situation and location of the semiconductor wafer W, and the like can be reliably grasped even during inspection on the basis of the wafer status graphically displayed on the display screen 161. Even if an error occurs in the probe apparatus 10, its location or the like can be instantly grasped, and a measure against the error can be readily taken.

FIG. 23 is a view showing another embodiment of the present invention and is a view showing the arrangement of a central management system for performing centralized management with respect to four sets of probe apparatuses. In this embodiment, each set of probe apparatuses is constituted by eight probers. Probers 10a of the first set are commonly connected to the input side of a multiplexer 30a, and the output side of the multiplexer 30a is connected to a video board 40a. Similarly, probers 10b and 10c of the second and third sets are respectively commonly connected to multiplexers 30b and 30c respectively connected to video boards 40b and 40c. These video boards 40a, 40b, and 40c are connected to a microcomputer 50. Via the microcomputer 50, the wafer status of each probe apparatus is displayed on a display screen 61 of a display device 60. The display screen 61 serves as an operation panel. As shown in FIG. 23, the display screen 61 can display a desired wafer status of each set among the plurality of sets of probe apparatuses. FIG. 24 shows a state wherein the window is switched for each probe apparatus to display the operation panel, the wafer status, or the like on the display screen 61. The display screen 61 displays the wafer statuses of the four sets of probe apparatuses 10. Of the 4×8 probers, four desired probers can be simultaneously monitored. Eight touch buttons 1 to 8 on the right side on the display device are buttons for selecting one of the eight probers of each set.

Note that the present invention is not limited to the probe apparatus in the above embodiments, and can be widely applied to various types of inspection apparatuses whose interiors cannot be seen from the outside. For example, although an inspected semiconductor wafer is returned in a cassette or a vessel storing inspection targets exemplified as semiconductor wafers, another vessel may be arranged in the apparatus and the inspected semiconductor wafer may be conveyed into this vessel. The inspection target is not limited to a semiconductor wafer and may be, e.g., a glass substrate having a TFT formed thereon, which is used for an LCD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. An inspection apparatus comprising:

an inspection section configured to electrically inspect at least one semiconductor element formed on a semiconductor wafer;

a loader section having at least one cassette containing a plurality of semiconductor wafers arranged in a predetermined order, said loader section further having a mechanism configured to convey an uninspected semiconductor wafer from an ordered location in the at least one cassette to the inspection section where the uninspected semiconductor wafer is inspected and then to convey an inspected semiconductor wafer back to the ordered location;

a display device having a display screen;

a wafer state display driver configured to cause a real time display of images on the display screen corresponding to the ordered locations of the semiconductor wafers in said at least one cassette, said images including a showing of an already inspected semiconductor wafer that is visually distinguishable from a showing of an uninspected semiconductor wafer, said display device having a CH totalization key; and means for displaying a channel totalization window on the display screen when the CH totalization key is operated, said channel totalization window displaying a table indicating at least a channel number and nondefective/defective relative to each corresponding channel number.

2. An apparatus according to claim 1, wherein each of said semiconductor wafers in the at least one cassette is arranged to extend horizontally with each semiconductor wafer being stacked vertically in said predetermined order.

3. An apparatus according to claim 1, wherein said showing of an already inspected semiconductor wafer is visually distinguishable from the showing of an uninspected semiconductor wafer because different colors are used.

4. An apparatus according to claim 1, wherein said channel totalization window includes a measuring wafer key for confirming a channel totalization result for a semiconductor wafer during measurement.

5. An apparatus according to claim 1, wherein said totalization window includes a lot key for confirming a channel totalization result for an inspected semiconductor wafer during measurement.

6. An inspection apparatus comprising:

an inspection section configured to electrically inspect a plurality of semiconductor elements formed on each of plural semiconductor wafers;

a loader section having at least one cassette containing a plurality of slots into which the plural semiconductor wafers are, respectively, inserted, said slots being arranged in a predetermined order;

a mechanism configured to convey each uninspected semiconductor wafer from a respective slot in the at least one cassette to the inspection section where the uninspected semiconductor wafer is inspected and to then convey each inspected semiconductor wafer back to the respective slot;

a display device having a display screen;

a wafer state display driver configured to cause a real time display of images on the display screen corresponding to the ordered locations of the semiconductor wafers in said at least one cassette, said images including a showing of an already inspected semiconductor wafer that is visually distinguishable from a showing of an uninspected semiconductor wafer, wherein said display screen has a first portion and a second portion with the images being displayed in the first portion, and an additional driver configured to cause a display of an inspection result of the semiconductor elements on each inspected semiconductor wafer as a wafer map on the second portion, wherein said additional driver is further configured to cause the display of the wafer map in response to a touching of an image of an inspected wafer in a respective slot displayed in the first portion of said screen.

* * * * *